(12) United States Patent
daCosta et al.

(10) Patent No.: US 8,514,852 B2
(45) Date of Patent: Aug. 20, 2013

(54) REAL TIME PACKET TRANSFORMS TO AVOID RE-TRANSMISSION

(75) Inventors: Francis daCosta, Santa Clara, CA (US); Sriram Dayanandan, Santa Clara, CA (US)

(73) Assignee: Mesh Dynamics, Inc., Santa Clara, CA (US)

( * ) Notice: Subject to any disclaimer, the term of this patent is extended or adjusted under 35 U.S.C. 154(b) by 939 days.

(21) Appl. No.: 12/625,365

(22) Filed: Nov. 24, 2009

(65) Prior Publication Data

US 2010/0128725 A1    May 27, 2010

Related U.S. Application Data

(60) Provisional application No. 61/117,502, filed on Nov. 24, 2008.

(51) Int. Cl.
*H04L 12/28* (2006.01)
*H04J 3/16* (2006.01)
*H04J 3/24* (2006.01)
*G06F 11/00* (2006.01)

(52) U.S. Cl.
USPC ........... 370/389; 370/466; 370/467; 370/473; 714/52; 714/800

(58) Field of Classification Search
None
See application file for complete search history.

(56) References Cited

U.S. PATENT DOCUMENTS

| | | | | |
|---|---|---|---|---|
| 5,935,268 | A * | 8/1999 | Weaver | 714/758 |
| 8,144,637 | B2 * | 3/2012 | Goldberg | 370/311 |
| 2006/0193325 | A1 * | 8/2006 | Takagi et al. | 370/395.5 |
| 2007/0144618 | A1 * | 6/2007 | Adar | 148/304 |
| 2007/0174875 | A1 * | 7/2007 | Medford et al. | 725/70 |

* cited by examiner

*Primary Examiner* — Faruk Hamza
*Assistant Examiner* — Thinh Tran
(74) *Attorney, Agent, or Firm* — Cherskov Flaynik & Gurda LLC

(57) ABSTRACT

There exists a need to reduce re-transmission delays in real time feeds (such as video) by sending the packet with sufficient repair/recovery information inside the packet container so the relaying stations and/or the receiving devices can fix errors in transmission by perusing the contents of the packet and the repair information, and modify the packet and then relay it. By providing the relaying station the ability to fix the error, retransmission of the packet is avoided along each relay station along the network path from source to destination and also by receiving devices that would otherwise request a re-transmission. This application teaches a method so real time streams (e.g. video) may be more efficiently transported over a CSMA based network.

16 Claims, 7 Drawing Sheets

Packet Format to Reduce Packet Re-Transmissions

Prior Art Approach
- RTP Video Packet -

New Approach
- Modified Container Packet -

US 8,514,852 B2

REAL TIME PACKET TRANSFORMS TO AVOID RE-TRANSMISSION

CLAIM OF PRIORITY

This application claims the benefit and priority of U.S. Provisional Application Ser. No. 61/117,502, filed on Nov. 24, 2008, and entitled "REAL TIME PACKET TRANSFORMS TO AVOID RE-TRANSMISSION", commonly assigned with the present application and incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to the transmission of information by way of Internet Protocol (IP) packets, and in particular the transmission of realtime information over a medium where a checksum error in a received packet would normally result in a re-transmission of that packet.

BACKGROUND OF THE INVENTION

There are an increasing plethora of IP based devices that transmit IP based packets over both wired and wireless medium. Many of these devices are designed for applications where the end destination of the transmission from the device is remote and the packets are being routed/relayed from network node to network node over multiple hops before arriving at their destination. Chances of an error in transmission increases with increased number of relays (hops). Since according to standard protocols, the entire packet needs to be re-transmitted, this affects the overall throughput of the entire relay network. Further, in some cases, re-transmission is not an option, as in real time video streams. In that case, a glitch appears on the user screen, adversely affecting the overall user experience. While annoying, glitches may be tolerable, but a significant delay of a real-time video packet may not. Also, methods are known such as drop-out compensators that repair video glitches before display.

Fragmentation of data packets—that is, sending multiple smaller packets as opposed to a single large sized packet—is one technique to reducing retransmission costs. Reducing the size of the packet limits re-transmission to a small packet with a checksum error. If noise effects causing re-transmissions are independent of packet size, then reducing packet size should proportionally reduce the number of re-transmissions. Thus, if a particular transmission relay chain has an error in transmission of one byte in every 100 bytes transmitted, and if all transmissions were one byte in size then the overall efficiency of transmission would be around 100/101 (including one retransmission). Conversely, if the packet size was 100 bytes then in theory each packet sent would have around one byte in error, causing the entire 100 byte packet to be resent. Recall that the checksum applies to the entire packet contents and the checksum error cannot tell you exactly which bytes in the packet were incorrectly received.

Fragmentation of large packets is used for latency insensitive transmissions (e.g. file transfers). Unfortunately it does not apply to time sensitive transmissions like real time video feeds because of the effects of protocols such as CSMA and the associated back off delays. CSMA based algorithms have increasingly large back offs for small packet sizes. This results in increased transmission latencies/delays. As a result, real time feeds (such as video feed frames with typically around 1300 bytes) are not fragmented since it would be inefficient in terms of both throughput and latency to send small packets using CSMA based networks.

For real time feeds where retransmission is not a viable option, there exists a need for an alternative approach, one that involves fixing corrupted packets at each relay station so that re-transmission requests are not required.

SUMMARY OF THE INVENTION

There exists a need to reduce re-transmission delays in real time feeds (such as video) by sending the packet with sufficient header repair information inside the packet container so the relaying stations and/or the receiving devices can fix transmission errors in corrupted packet headers by perusing the contents of the packet and the repair information, modifying the packet header and then relaying it. By providing the relaying station the ability to fix the error before relaying, retransmission of the packet is avoided along each relay station along the network path from source to destination.

Although the description herein focuses on the 802.11 standard and in particular the CSMA/CA protocol, it is applicable to any networking protocol that includes re-transmission of a corrupted packet. It is more applicable to wireless, since the transmission errors are uncommon when there is enough bandwidth, there are not multiple hops, or when the transmission lines are cleaner (less noise). It matters more for wireless and in particular wireless mesh networks inasmuch as there is frequently not enough bandwidth available; with each hop there is the possibility of a retransmission request (all the way back to the source and potentially many hops away and also many milliseconds away); and the RF interference in the wireless medium may prevent the retransmitted packet from faring any better. Thus, the solution as described for the present invention is to fix an error whenever possible at each hop and send the packet onward so that re-transmissions are not required.

The present invention teaches a method whereby, without resorting to fragmentation, real time feeds may be efficiently transported over a collision-based network, and in particular a wireless CSMA based network. The present invention addresses an approach to reduce the number of re-transmissions of large packets over wireless due to errors in transmission detected by the CRC checksum error supplied at the end of each packet. Currently, a checksum error results in a request for the entire packet to be re-transmitted by the networking protocol, resulting in effective throughput loss and increased effective transmission delay (also referred to as latency). While packet re-transmission reduces overall performance regardless of the size of the packet, its effects are more dramatic as packet sizes increase. Further, if the packet content contains time sensitive information, then the results also affect the overall user experience.

As an example, video packets with check sum errors cause glitches to appear on the viewing screen. Buffering an entire video and ensuring all packets are correctly received is commonly done for web videos, but is the last resort option for a real time video feed, in particular for video surveillance applications. Thus, buffering has limited applicability where real time video streaming is required. One representative application is high quality IP based real time video surveillance where the IP based cameras are transmitting real time video feeds to a remote location, sometimes over many relay "hops" and over a wireless medium.

For the purposes of illustration, we will restrict the implementation of how a real time format is modified to contain the repair information and focus on repair of the header information. We refer to the packet thus modified according to this invention as the transformed or modified video packet and also refer to this as the transformed or modified packet container. Each relay station along the network path will be equipped with the ability to recognize this modified data format and knows how to apply the corrections prior to transmitting the packet to the next relay station. The format chosen for illustration is the RTP (Real Time Protocol) format for video frames over Ethernet.

Note that the term relay station is used since one significant application of this technology will be transmitting video over long range wireless links which, due to RF interference effects, result in poor reception at the receiving end and normally require re-transmissions. The relay stations often are multiple, forming a "string-of-pearls" network with each relay station suffering from similar RF conditions regarding poor reception quality, especially with long range wireless transmissions. Each of these relay stations have software resident in them to recognize the specialized formats of a packet modified according to this invention that contains header repair information that enables reconstruction of the video packet without requesting a costly re-transmission. When only header information is repaired according to the present invention, the packet may still contain video glitches, however at least the packet will get through in real time without re-transmission.

The same software may also be included in wired or wireless based network connected devices (laptops, phones, wireless wearable headsets) that receive the transformed data packet format and have the software control algorithms described in this application to repair and reconstruct damaged packet contents without requiring re-transmission.

BRIEF DESCRIPTION OF DRAWINGS

In order to more fully describe embodiments of the present invention, reference is made to the accompanying drawings. These drawings are not to be considered limitations in the scope of the invention, but are merely illustrative.

DETAILED DESCRIPTION OF SPECIFIC EMBODIMENTS

Figure 1:
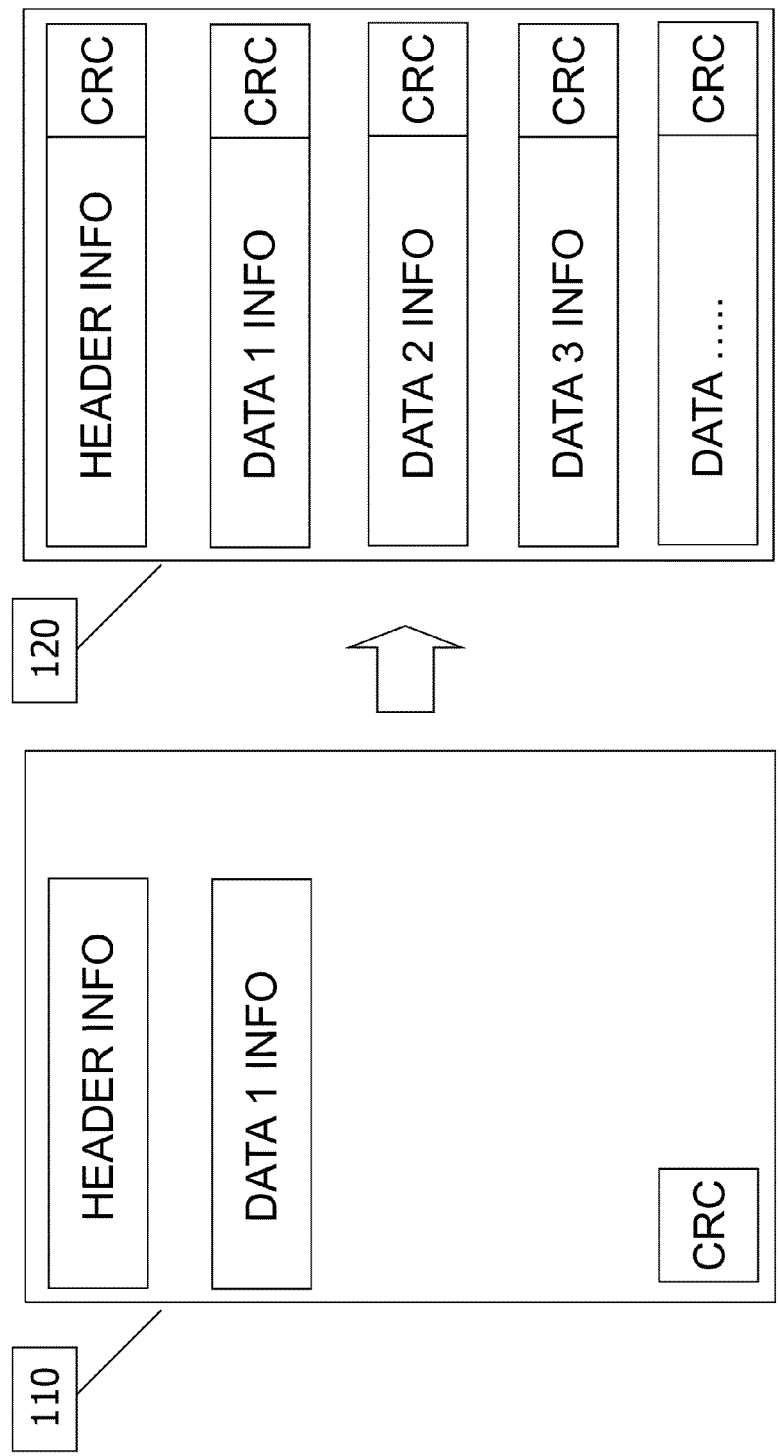
FIG. 1 shows the core methodology described for the present invention, namely to transmit a container packet with CRC checksum errors for sections of the container, to enable intelligent recovery (without transmission) over each part of the video packet as opposed requesting a re-transmission of the entire video packet. The intelligent recovery will be driven by software control algorithms that will attempt to reconstruct sections of the packet based on information contained in the revised video container packet described in details in other figures. Although the present invention is focused on repair of the packet header, the same principles and methods may also be applied to multiple fragmented sections of the video content should the available bandwidth allow.

Referring to FIG. 1, the conventional or standard approach 110 for the IP packet structure, results in a request for retransmission if the checksum error applied to the entire packet is incorrect—that is, does not properly match or correspond with the packet contents. There is no information provided to repair or reconstruct sections of the packet. Conversely, as noted in diagram 120, video packet information according to the present invention has been split up into individual sections, which may include header sections and/or video data sections, each with their own check sum errors and duplicated data (as will be described later) to enable resident software on the relaying or receiving devices to recover from the faulty transmission without a re-transmission request.

Figure 2:
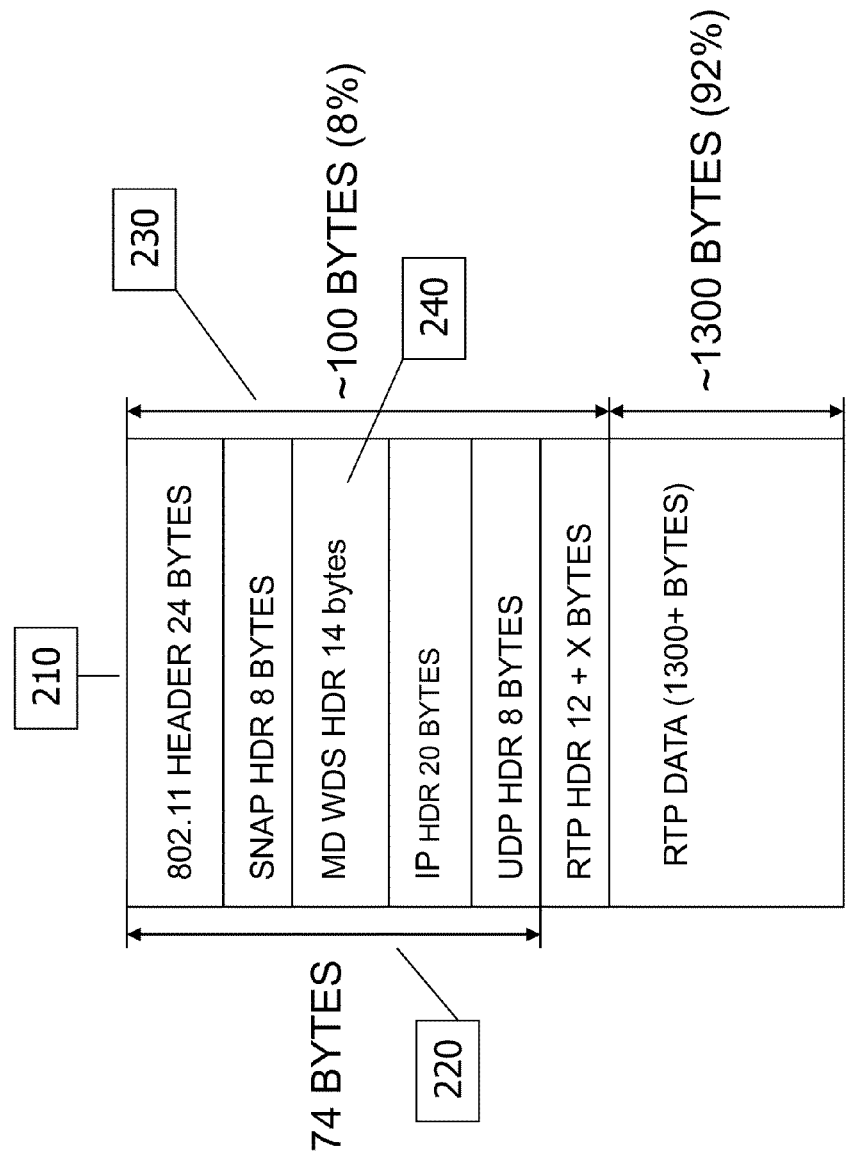
FIG. 2 shows the typical video packet. Note that around 100 bytes contains the header information which is critical for packet routing. The rest of the packet (around 1300 bytes) is the data payload, such as video content. This can modified to be fragmented with CRC checksum errors for each section.

Referring to FIG. 2, diagram 210 describes the standard IEEE video packet format for transmission over 802.11 based wireless systems. Note that a critical section of the packet is the header information 220, comprising 74 bytes containing source and destination IP addresses etc. Together with the RTP header, all header information 230 constitutes around 8% of the entire packet and yet, if there are errors in transmission in any of this header information, an entire packet has to be re-transmitted. The implementation described in this application seeks to obviate that unnecessary and inefficient re-transmission by placing repair-related reference information and duplicated key critical information inside the transformed video packet container in order to repair a corrupted header Field 240 labeled "MD WDS HRD 14 Bytes" has been added according to the present invention and includes additional information to allow repair of corrupted information.

Figure 3:
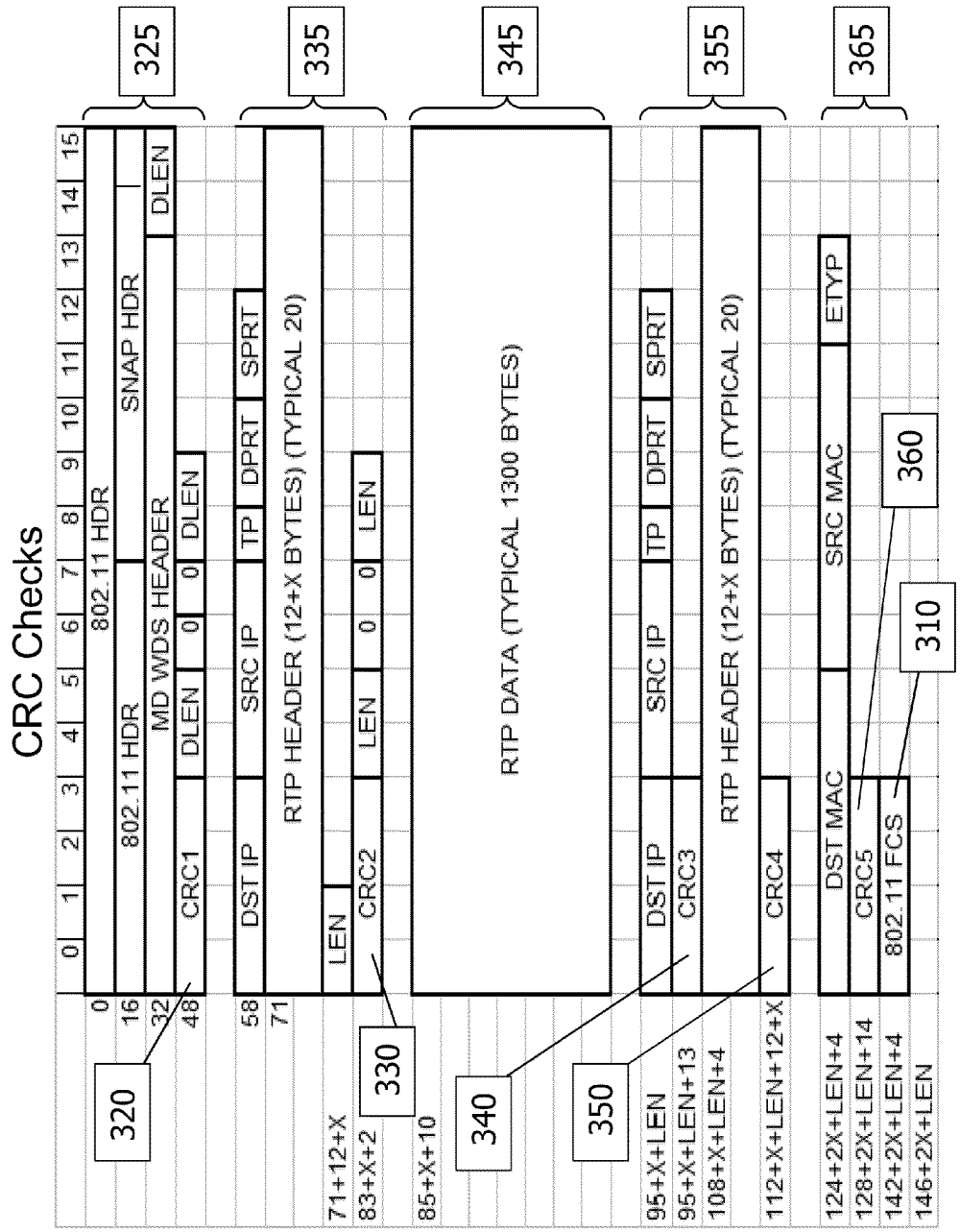
FIG. 3 depicts one possible implementation of a modified video container packet according to the present invention. For the purposes of brevity, the RTP packet is not shown as fragmented and the focus is on the header information. However, the logic described to recover from checksum errors, without requesting re-transmission, are also applicable to both one single video content section and multiple (fragmented) video content sections in the container packet.

Referring to FIG. 3, if there is an error in transmission in the transformed video packet container then the 802.11 Frame Check Sequence or FCS 310 indicates an error. According to the present invention, instead of initiating a re-transmission, resident software in the relay stations or receiving devices will check to see if the error may be repaired based on a series of check sums 320, 330, 340, 350, and 360. Checksum 320 is the 802.11 Layer 2 checksum, and checksum 330 is the checksum related to Layer 3 and IP layers above Layer 3. Note that the figure restricts the description to check sum errors for header portion 230 shown in FIG. 2. No recovery CRC is shown for RTP data section 345 for the sake of brevity. However the techniques described herein may be applied to that section as well.

Referring again to FIG. 3, note that certain critical parts of the 802.11 header information labeled "802.11 HDR" in section 325 are repeated in section 365. These include the field called DST MAC (destination MAC address) and SRC MAC (Source MAC address) which are critical for routing the packet to the correct destination and communicating back to the originating device. Sections 325 and 365 have their own CRC check sums which are CRC1 320 and CRC5 360 respectively. The process of recovering key information from the 802.11 HDR section is described in FIG. 4 where the duplicated/redundant information is used to repair a packet when a checksum mismatch or error occurs indicating that a portion of the packet has been corrupted during transmission.

In similar fashion, key fields within RTP header information 335 are repeated in section 355 with associated CRC checksums CRC2 330 for the original and CRC3 340 and CRC4 350 for the duplicated RTP header information. Note two checksums are used for the duplicated RTP header. In the event that CRC2 330 for section 335 is in error, then each of the two sub sections of the RTP header information may be recovered independently.

Figure 4:
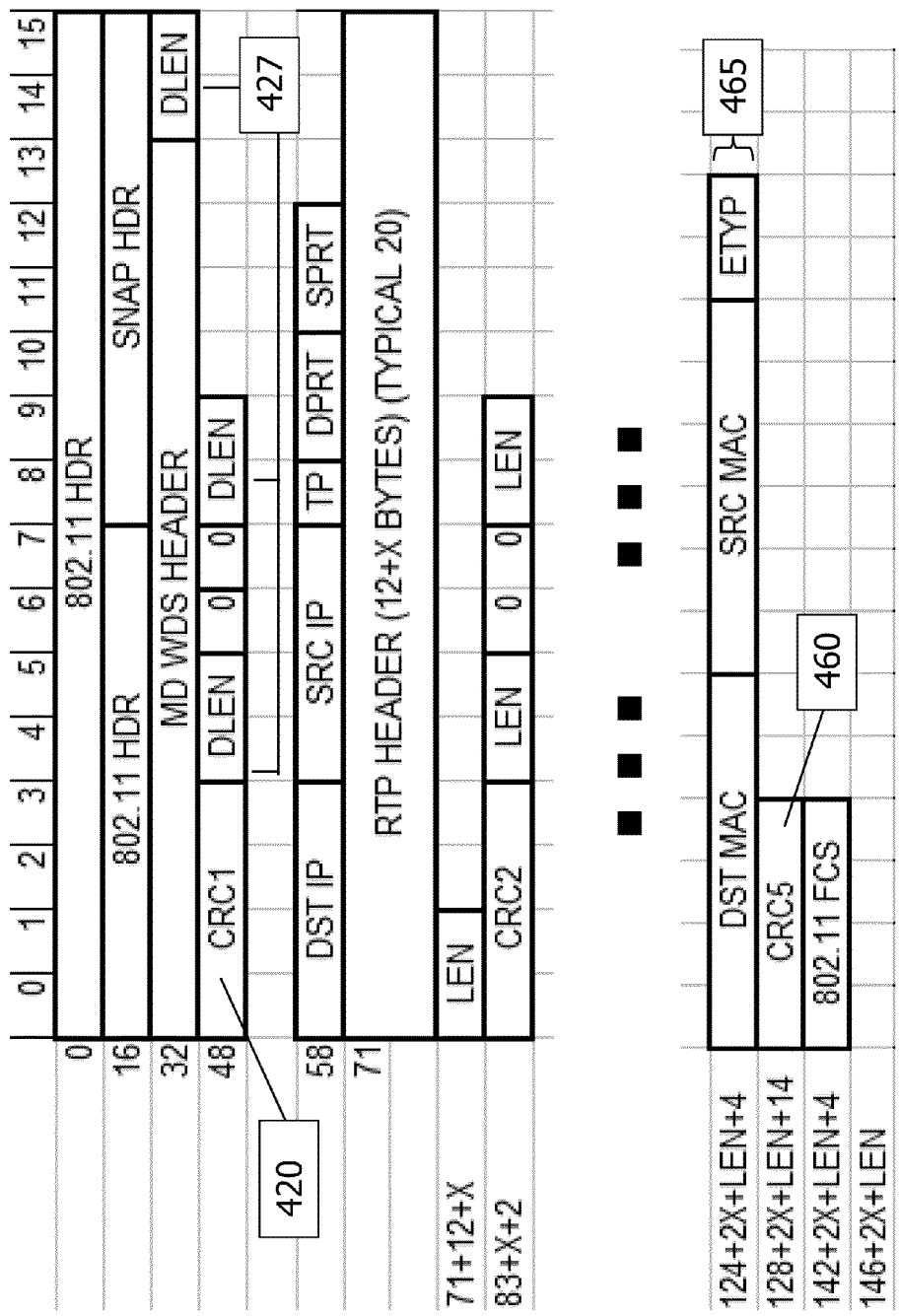
FIG. 4 is a close up view of the header section of the control packet and how additional information is built into the video packet format to ensure recovery of the header information from data provided inside the packet. The information provided is designed aid the software resident at each relay station to repair/reconstruct the packet header without requesting a re-transmission of the entire packet.
Figure 5:
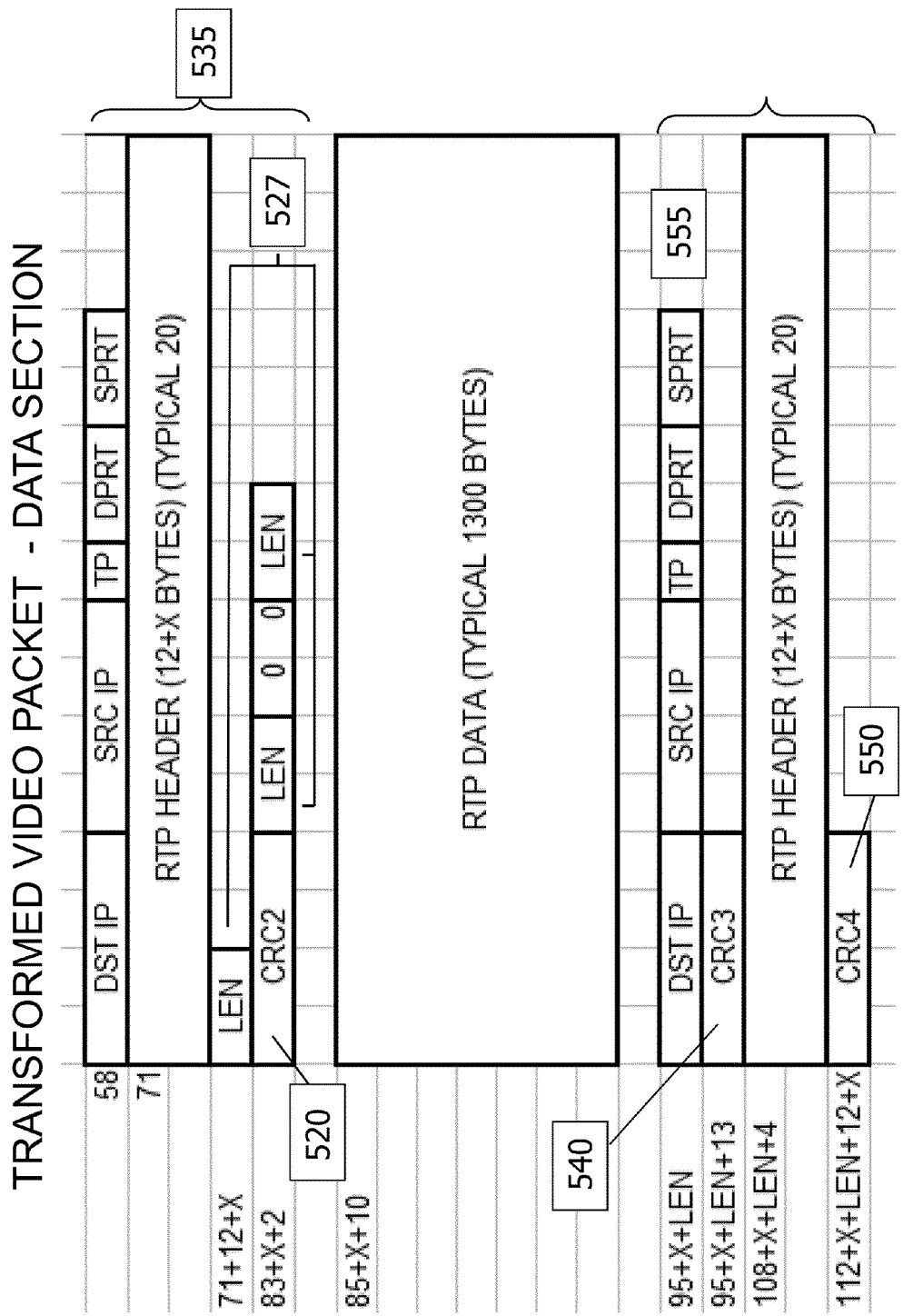
FIG. 5 is a close up view of the content section of the control packet. For the purposes of brevity, the modified format relates to one RTP packet. However the logic described to repair/reconstruct the content section of the container packet is applicable to multiple video content packets contained in the same larger container packet.

As stated earlier, in the event that the 802.11 FCS 310 indicates there is an error in transmission, then the error could have appeared in either 802.11 header section 325, RTP header section 335, or RTP data section 345. FIGS. 4 and 5 describe the data recovery process for the 802.11 header section and the RTP header sections respectively. For the sake of brevity no data recovery for the RTP data section is described, however it would follow the same methodology as that described here and would be applicable to both single and multiple RTP data sections. If CRC1 320 is in error then item DLEN (the Data Length value shown at the end of the original header information section 325) is utilized as a position offset reference number that points to the duplicate data location. DLEN denotes the Data LENgth that needs to be skipped over from the location of the original header information 325 to the duplicate copy of the key header information. The key duplicated header information 365 contains information on DST MAC (destination MAC Address), SRC MAC (Source MAC address), etc.

FIG. 4 shows a possible format to repair/reconstruct the results of a faulty transmission affecting the 802.11 HDR section. If the CRC1 420 is correct, then the fault is not with the 802.11 header section and the software moves on to repair another section. If CRC1 420 is in error, then the item DLEN (the Data Length position offset reference described above) is used to find out where the duplicate/redundant data is offset from the original 802.11 header section. Note that the item DLEN 427 is repeated, appearing three times to ensure that the offset to find the location of the duplicated information 465 is correct. If all three of the DLEN instances do not match, then the packet must be discarded or if acceptable, re-transmitted. However, if the DLEN instances match, then the offset location is correctly located. The most key parts 465 of the header information, the DST MAC, SRC MAC, and ETYPE may be recovered with CRC5 460 as the local checksum for these.

FIG. 5 applies similar logic for the RTP header related information. In the event that there is an error in transmission of the RTP header section 535, then the checksum CRC2 520 will mismatch indicating so. The position offset reference number LEN 527 that points to the duplicate information needed for correction is also repeated three times. If all LEN instances match, then section 555 is accessed and the duplicate information, such as DST IP, are retrieved with CRC3 540 as checksum. For validating the entire RTP header, CRC4 550 is supplied.

Figure 6:
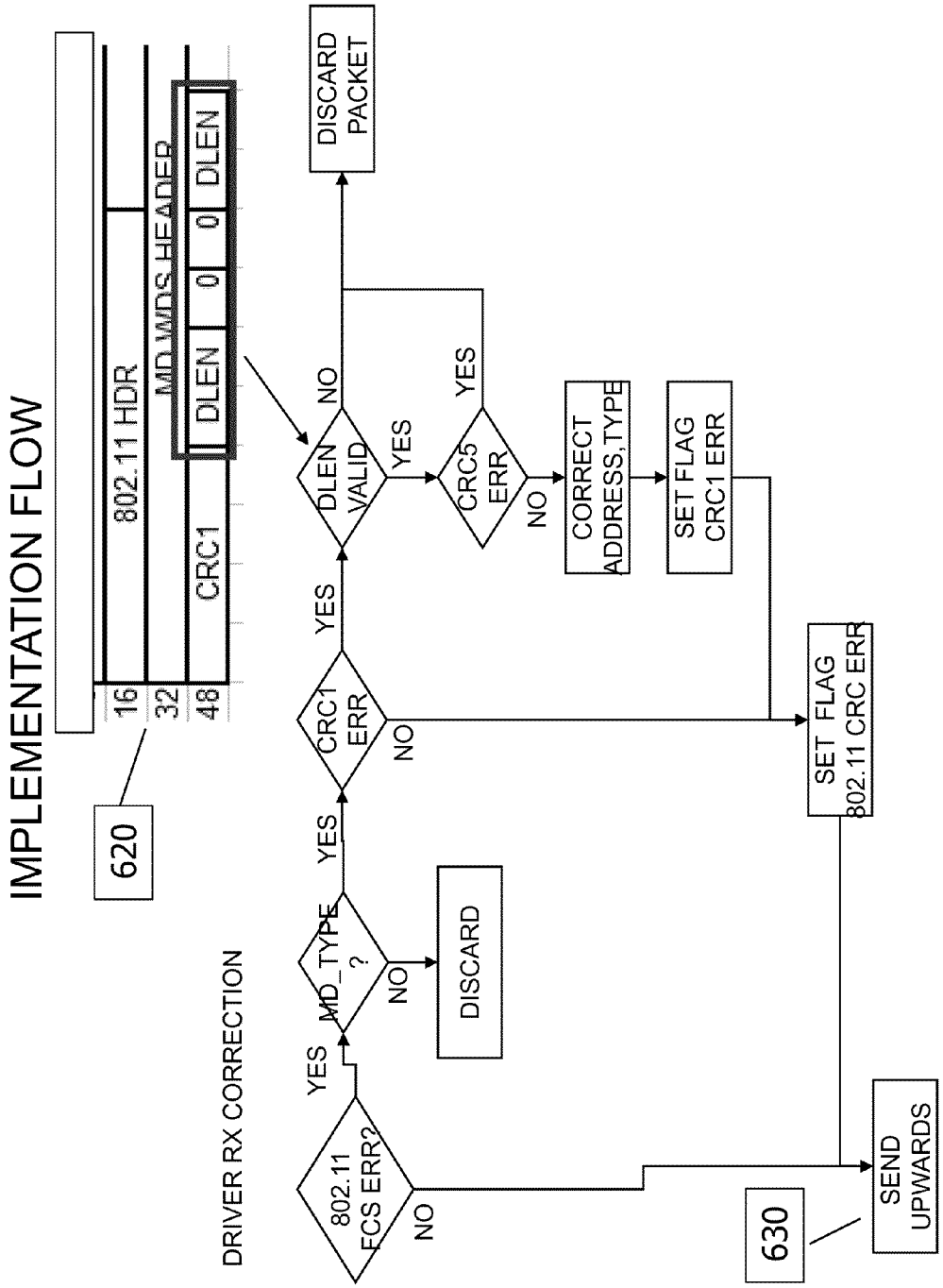
FIG. 6 depicts an implementation flow graph for the portion of the packet dealing with the IP header as described in this application.
Figure 7:
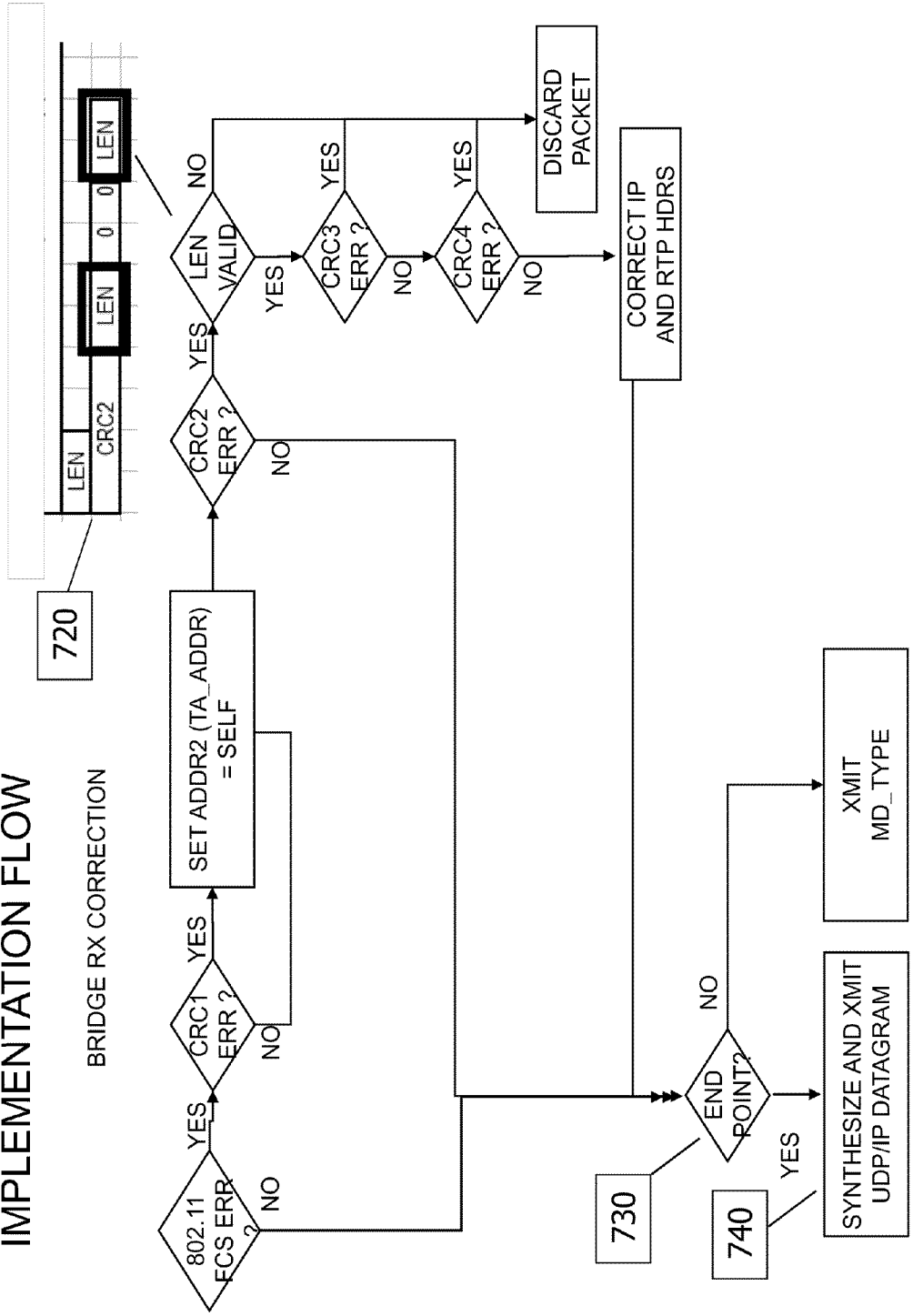
FIG. 7 depicts an implementation flow graph for the portion of the packet dealing with the RTP header and information as described in this application.

FIGS. 6 and 7 describe the flow charts associated with FIGS. 3 and 4. FIG. 6 deals with the 802.11 header section 620 when CRC 1 in header 620 indicates an error. When the process described in FIG. 6 reaches termination point 630 labeled "SEND UPWARDS", the process continues with the process shown in FIG. 7.

FIG. 7 shows the flow if CRC2 in header 720 indicates an error. When the process described in FIG. 7 reaches termination point 730 labeled "END POINT?" the system and software processing the packet must determine if the packet should be reformatted back to a standard 801.11 format. If the packet has in fact reached a termination point and will next be transmitted to or processed by conventional networking equipment and software, then it must be re-formatted 740 to remove the fields of information used in the transformed format according to the present invention and the checksums will be recalculated. If the packet will next be transmitted to or processed by networking equipment and software operating according to the transforms of the present invention, then the checksums are recalculated and the packet moved onward, retaining the transformed configuration according to the present invention.

The foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, steps preformed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A method for transmitting a standard format network packet containing real time information, comprising the steps of:

modifying said packet by adding redundant information to the packet;

modifying at least one packet header to add a position offset reference number that points to redundant information;

revising all checksums within the packet as modified to agree with the packet contents as modified;

transmitting the packet through a network; modifying the packet, including modifying all checksums, to return the packet's format to that of the standard packet format;

if the modified packet, having been transmitted through a network, is determined to have a checksum mismatch as received, modifying the packet by retrieving the redundant information pointed to by said position offset reference number and replacing a portion of the packet with said redundant information; and revising all checksums within the packet as modified to agree with the contents of the modified packet.

2. The method of claim 1 wherein the redundant information is exclusively header information.

3. The method of claim 2 wherein the redundant header information contains a checksum that specifically determines the validity of said redundant header information.

4. The method of claim 3 wherein the IP header and the RTP header of a packet containing real time information are both modified to add position offset references that point to redundant header information for each header respectively.

5. The method of claim 1 wherein a number indicating a specific position offset reference number is repeated multiple times as a means to later determine the validity of the position offset reference number after transmission.

6. The method of claim 2, wherein only redundant header information is included within the modified packet and no redundant information is included to provide for repair of RTP data.

7. The method of claim 1, wherein revising all checksums within the packet as modified to agree with the contents of the modified packet includes creating at least one checksum that matches real time video content containing errors.

8. A method for transmitting a standard format network packet containing real time information through a multi-hop network, comprising the steps of:
 modifying said packet by adding redundant header information to the packet;
 modifying at least one packet header within said packet to add a position offset reference number that points to redundant header information;
 revising all checksums within the packet as modified to agree with the packet contents as modified;
 transmitting the packet to a first relay node in the multi-hop network;
 if the modified packet as received by the first relay node is determined to have a checksum mismatch relative to header information, modifying the packet by retrieving the redundant header information pointed to by said position offset reference number and replacing a portion of the header information for the packet with said redundant header information;
 recalculating checksums as required within the packet to agree with the packet contents as modified;
 transmitting the modified packet to a second network node within the multi-hop network; and
 when the packet is received by an end point node within the multi-hop network, modifying the packet including recalculating all checksums to return the packet's format to that of the standard packet format.

9. The method of claim 8, wherein only redundant header information is included within the modified packet and no redundant information is included to provide for repair of real time information data.

10. The method of claim 8, wherein recalculating checksums as required within the packet to agree with the packet contents as modified includes creating at least one checksum that matches real time video content containing errors.

11. The method of claim 8 wherein the redundant header information contains a checksum that specifically determines the validity of said redundant header information.

12. The method of claim 8 wherein the IP header and the RTP header of a packet containing real time information are both modified to add position offset references that point to redundant header information for each header respectively.

13. The method of claim 8 wherein a number indicating a specific position offset reference number is repeated multiple times as a means to later determine the validity of the position offset reference number after transmission.

14. A method of transforming of an IP packet for transmission on an 802.11 network comprising:
 transforming the IP packet by adding redundant header information and position offset reference numbers that point to said redundant header information to the IP packet; and
 whereupon being received by a network node, said transformed IP packet is processed by the method comprising the steps of:
 examining the transformed packet to determine if a level 2 cyclic redundancy check data for the packet's Layer 2 header matches;
 if the level 2 cyclic redundancy check data for the Layer 2 header does not match, retrieving first redundant header information located within said transformed packet according to a first position offset reference number and repairing the Layer 2 header utilizing said first redundant header information;
 examining the transformed packet to determine if a level 3 cyclic redundancy check data for the packet's header related to Layer 3 and above matches;
 if the level 3 cyclic redundancy check data related to Layer 3 and above does not match, retrieving second redundant header information located within said transformed packet according to a second position offset reference number and repairing the header related to Layer 3 and above utilizing said second redundant header information; and
 if it is determined that the network node is not an end point node, recalculating all cyclic redundancy check data sets within the transformed packet as required to agree with the contents of the transformed packet thus repaired, and transmitting the transformed packet to another network node;
 converting the transformed packet to the standard 802.11 format if it is determined that the network node processing the transformed packet is an end point node, including recalculating cyclic redundancy check data sets within the transformed packet as required to agree with the contents of the transformed packet thus converted; and
 wherein a number indicating a specific position offset reference number is repeated multiple times as a means to later determine the validity of the position offset reference number after transmission.

15. The method of claim 14, wherein recalculating all CRCs within the transformed packet as required to agree with the transformed packet contents thus converted includes creating at least one checksum that matches real time video content containing errors.

16. The method of claim 14, wherein the redundant header information contains a CRC that specifically determines the validity of said redundant header information.

* * * * *